United States Patent [19]
Han et al.

[11] Patent Number: 5,898,210
[45] Date of Patent: Apr. 27, 1999

[54] SEMICONDUCTOR DIODE WITH HIGH TURN ON AND BREAKDOWN VOLTAGES

[75] Inventors: Weiyu Han, Edison; Peter G. Newman, Barnegat, both of N.J.

[73] Assignee: The United States of America as represented by the Secretary of the Army, Washington, D.C.

[21] Appl. No.: 08/665,160

[22] Filed: Jun. 14, 1996

[51] Int. Cl.$^6$ .................................................. H01L 27/095
[52] U.S. Cl. ........................... 257/471; 257/472; 257/476
[58] Field of Search .................................... 257/471, 472, 257/476, 279, 280, 762, 763, 764, 766; 320/17–19

[56] References Cited

U.S. PATENT DOCUMENTS

| | | | |
|---|---|---|---|
| 4,982,243 | 1/1991 | Nakahata et al. | 357/15 |
| 5,041,881 | 8/1991 | Bishop et al. | 257/472 |
| 5,100,835 | 3/1992 | Zheng | 257/762 |
| 5,374,862 | 12/1994 | Takano | 326/17 |

FOREIGN PATENT DOCUMENTS 5-226640  9/1993  Japan .

OTHER PUBLICATIONS

Zhang et al., Effect of LTGAAS OL Epitaxial AL/GAAS Schottky Diode Characteristics, in Defect Engineering in Semiconductor Growth, Processin and Device Technology Symposium, Materials Research Society, pp. 899–904. 1992.

Chen et al., "Schottky barrier enhancement using reacted Ni$_2$Al$_3$/ Ni, n–GaAs, Ni/Al/Ni/n–GaAs, and NiAl/Al/Ni/n–GaAs contacts," J. Appl. Phys., vol. 77, pp. 4777–4782, 1995.

Miller et al., "Al/Si/AlGaAs Schottky barriers by molecular beam epitaxy," Appl. Phys. Lett., vol. 61, pp. 2332–2334, 1992.

Smith et al., "New MBE Buffer Used to Eliminate Backgating in GaAs MESFET's," IEEE Electron Device Letters, vol. 11, No. 12, pp. 77–80, Feb. 1988.

Yin et al., "Improved Breakdown Voltage in GaAs Mesfet's Utilizing Surface Layers of GaAs Grown at a Low Temperature by MBE." IEEE Electron Device Letters, vol., 11, No. 12, pp. 561–563. Dec. 1990.

Chen et al., "High–Power–Density GaAs MISFET's with a Low–Temperature–Grown Epitaxial Layer as the Insulator." IEEE Electron Device Letters, vol. 12, No. 6, pp. 306–308. Jun. 1991.

Look et al., "Deep traps in molecular–beam–epitaxial GaAs grown at low temperatures." Journal of Applied Physics, 76(2), pp. 1029–1032. Jul. 1994.

(List continued on next page.)

*Primary Examiner*—Sara Crane
*Attorney, Agent, or Firm*—Michael Zelenka; John M. O'Meara

[57] ABSTRACT

A Schottky diode having a series of stacked layers starting with a conventional substrate having a semi-insulating GaAs layer and an un-doped GaAs buffer layer. An n-type Si—GaAs channel layer is grown on the GaAs buffer layer. A low-temperature-grown GaAs barrier layer covers the center portion of the upper surface of the n-type channel layer. The Schottky diode comprises two terminals. One diode terminal comprises a ohmic contact deposited on the upper surface of the channel layer. This ohmic contact, which is ring-shaped, encircles the barrier layer. The other diode terminal includes a metal layer that forms a Schottky contact with the upper surface of the barrier layer. The Ga-to-As ratio in the low-temperature-grown GaAs barrier layer is adjusted so that the barrier layer contains a sufficient number of free electrons to support current flow for bias voltages above the Schottky barrier height. Under reverse bias, the barrier layer acts as an insulator, preventing diode breakdown at relatively high reverse bias voltages.

19 Claims, 2 Drawing Sheets

OTHER PUBLICATIONS

Chen et al., "Self–Aligned GaAs MISFET's with a Low–Temperature–Grown GaAs Gate Insulator." IEEE Electron Device Letters, vol. 16 No. 5, May 1995, pp. 199–201.

Kim et al., "Microwave Power GaAs MISFET's with Undoped AlGaAs as An Insulator." IEEE Electron Device Letters, vol. EDL–5, No. 11, Nov. 1984. pp. 494–495.

Hozhabri et al., "Infrared measurements in annealed molecular beam epitaxy GaAs grown at low temperature." Applied Physics Letters, 66(19), pp. 2546–2548, May 1995.

5,898,210

SEMICONDUCTOR DIODE WITH HIGH TURN ON AND BREAKDOWN VOLTAGES

GOVERNMENT INTEREST

The invention described herein may be manufactured, used, sold, imported and licensed by or for the Government for governmental purposes without the payment to us of any royalty thereon.

FIELD OF THE INVENTION

This invention relates generally to the field of microelectronics and more specifically to Schottky diodes which are particularly suitable for use in high-power, low-noise applications.

BACKGROUND OF THE INVENTION

Schottky diodes, used extensively in discrete digital and analog semiconductor devices and integrated circuits, comprise a solid-state junction formed by metal-semiconductor contact. Such diodes are typically fabricated from n-type or p-type material and metal. The metal is normally evaporated or sputtered onto the doped material at low temperatures to form a Schottky-diode junction at the metal-semiconductor interface. Conventional Schottky diodes are characterized by extremely rapid switching capability and have been used at high and ultrahigh frequencies as mixers, harmonic generators, detectors and the like. Schottky-diode junctions are also used in the manufacture of depletion- and enhancement-mode field effect transistors.

Schottky diodes normally have relatively low turn-on voltages, low breakdown voltages and significant forward leakage currents at only a few tenths of a volt (V). These features, while satisfactory in some applications, limit the usefulness of conventional Schottky diodes in electrical and optical applications where high power, low-leakage current and/or low noise are required. Those concerned with the development and application of Schottky diodes have long recognized the need to improve their high-power, low-noise performance characteristics. The present invention fulfills this need.

SUMMARY OF THE INVENTION

The general purpose of this invention is to provide a high-power Schottky diode having a Schottky barrier height substantially greater than that found in current Schottky diodes.

According to one aspect of the invention, a Schottky diode has a series of stacked layers including a substrate with a buffer layer, a high-quality doped channel layer grown on the buffer layer, and a barrier layer grown on the upper surface of the channel layer. The Schottky diode comprises two diode terminals. One diode terminal forms an ohmic contact with the upper surface of the channel layer. The other diode terminal makes a Schottky contact with the upper surface of the barrier layer. The barrier layer contains a sufficient number of free electrons to support forward current flow for bias voltages above the Schottky barrier height. Under reverse bias, the barrier layer acts as a good insulator, preventing diode breakdown at relatively high reverse bias voltages.

More specifically, the present invention is a Schottky diode comprising a semiconductor substrate, a channel layer grown on the substrate and a barrier layer grown on the channel layer. The barrier layer includes a non-stoichiometric layer of un-doped, low-temperature-grown semiconductor material having a sufficient quantity of free charge carriers to support current flow therein. The diode includes a first diode terminal deposited on the channel layer and a second diode terminal deposited on the barrier layer such that the second diode terminal forms a Schottky-diode junction at the interface of the second diode terminal and the barrier layer. The charge carriers are electrons and the channel layer includes a layer of n-type material. The barrier layer comprises means for maintaining the free electrons therein when a forward bias is applied to the diode terminals and for depleting the barrier layer of the free electrons when a reverse bias is applied to the diode terminals.

Still further, the non-stoichiometric layer of un-doped, low-temperature-grown semiconductor material comprises gallium-arsenide. The channel layer comprises a region of gallium-arsenide doped with silicon. The first diode terminal includes an ohmic contact formed from layers of gold, germanium, nickel, silver and gold. The second diode terminal includes metal layers of titanium and gold.

The exact nature of this invention, as well as other objects and advantages thereof, will be readily apparent from consideration of the following specification relating to the annexed drawing figures.

DETAILED DESCRIPTION OF THE PREFERRED EMBODIMENTS

Figure 1:
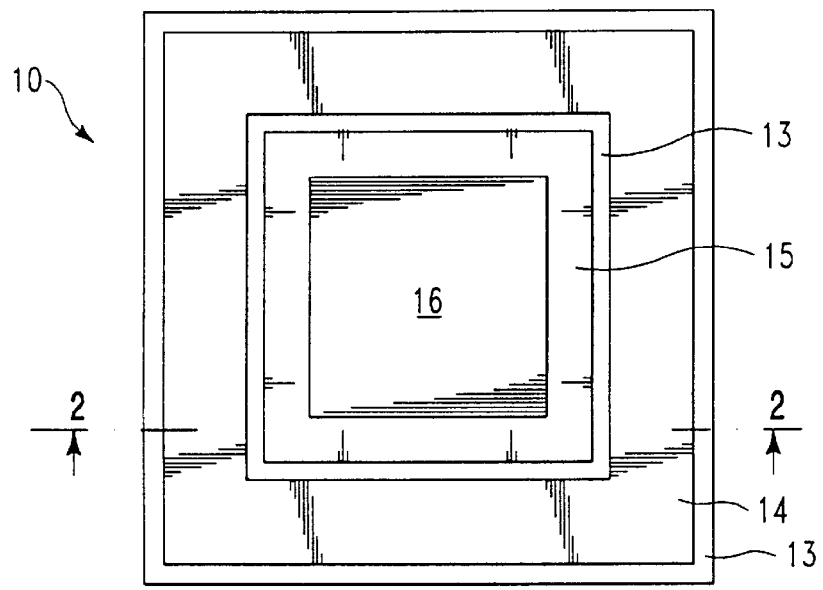
FIG. 1 is a top plan view of a Schottky diode in accordance with the present invention.
Figure 2:
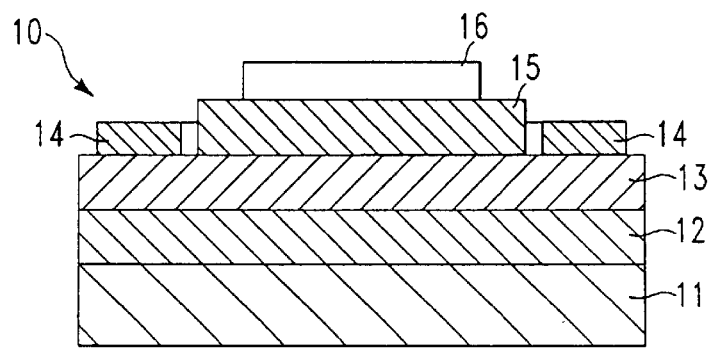
FIG. 2 is an elevation view in cross section taken on the line 2—2 of FIG. 1 looking in the direction of the arrows.

Referring now to the drawings, FIGS. 1 and 2 depict Schottky diode 10 having a series of stacked layers starting with a conventional substrate having substrate layer 11 and buffer layer 12. Channel layer 13 mounts on buffer layer 12 while barrier layer 15 covers the center portion of the upper surface of channel layer 13. Schottky diode 10 comprises a pair of diode terminals in the form of ohmic contact 14 and Schottky contact 16. Ohmic contact 14, which comprises a ring-shaped layer of metal alloy deposited near the periphery of channel layer 13, encircles barrier layer 15. Schottky contact 16 comprises a layer of metal alloy that forms a Schottky junction with the upper surface of barrier layer 15.

Figure 3:
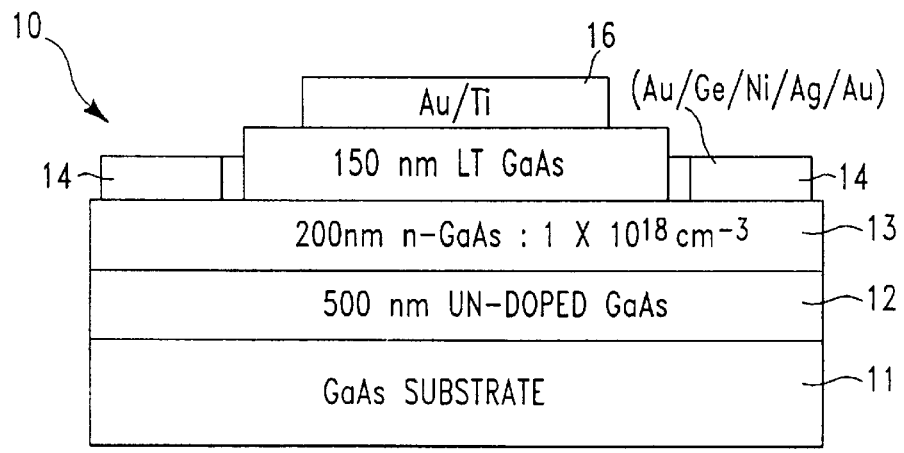
FIG. 3 is an elevation view similar to that of FIG. 2, with the addition of labels identifying specific fabrication materials.

FIG. 3 illustrates a cross section, similar to that of FIG. 2, showing the layers of Schottky diode 10 with the addition of labels that identify preferred fabrication materials. Specifically, substrate layer 11 preferably comprises a conventional semi-insulating layer of gallium-arsenide (GaAs). Using conventional molecular-beam-epitaxy (MBE) techniques, the fabricator grows a 500 nanometer (nm) thick buffer layer 12 of un-doped GaAs on the upper surface of substrate layer 11. GaAs buffer layer 12 covers any defects and imperfections in the surface of GaAs substrate layer 11 so that a high-quality channel layer may be grown thereon.

Next, the diode fabricator grows channel layer 13 on the upper surface of GaAs buffer layer 12. Channel layer 13 comprises a 200 nm thick layer of doped GaAs. Channel layer 13, which functions as the active region of diode 10, provides a main current path for electrons flowing between Schottky contact 16 and ohmic contact 14. Although a number of suitable dopants may be used to fabricate channel layer 13, the present invention contemplates the use of silicon (Si) as the preferred dopant. Specifically, the diode fabricator grows channel layer 13 as a layer of GaAs:Si having a nominal doping of $1 \times 10^{18}$ per cubic centimeter. This process produces a high-quality channel of n-type material located on the upper surface of buffer layer 12.

Barrier layer 15 is then fabricated by non-stoichiometrically growing via MBE a 150 nm thick layer of un-doped, low-temperature-grown (LT) GaAs on the upper surface of channel layer 13. The Ga-to-As ratio in LT GaAs barrier layer 15 is appropriately adjusted so that barrier layer 15 contains a sufficient number of free electrons to support current flow therein. Further, as will be seen below, when a reverse bias depletes barrier layer 15 of its free electrons it acts like a GaAs insulator.

Finally, the diode fabricator constructs the pair of diode terminals, ohmic contact 14 and Schottky contact 16. Ohmic contact 14 preferably contains a gold-germanium-nickel-silver-gold (Au/Ge/Ni/Ag/Au) structure that the fabricator deposits on the upper surface of channel layer 13. Schottky contact 16 preferably comprises layers of titanium and gold deposited on barrier layer 15 such that it forms a Schottky-diode junction at the interface.

The introduction of low-temperature-grown GaAs barrier layer 15 between channel layer 13 and Schottky contact 16 results in a diode device having a higher diode turn-on voltage with a relatively low forward current and extremely high breakdown voltage. Additionally, diodes made in this manner exhibit very small leakage currents under very high reverse bias.

Figure 4:
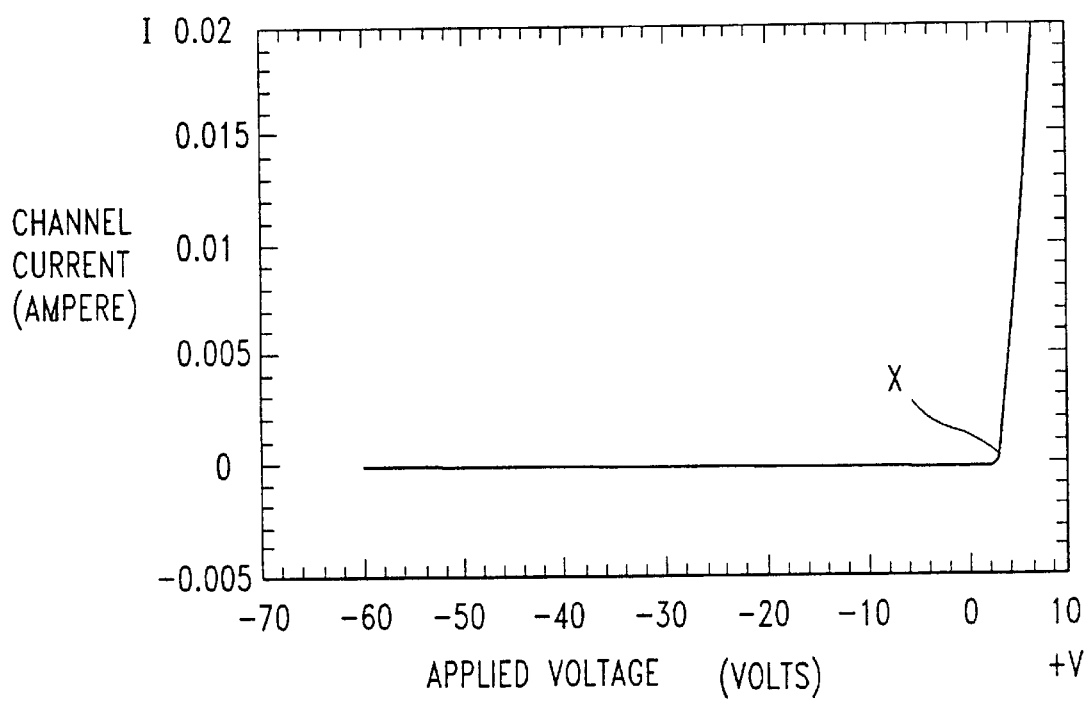
FIG. 4 is a graph of diode current vs. applied voltage useful in understanding the performance characteristics of the present invention.
Figure 5:
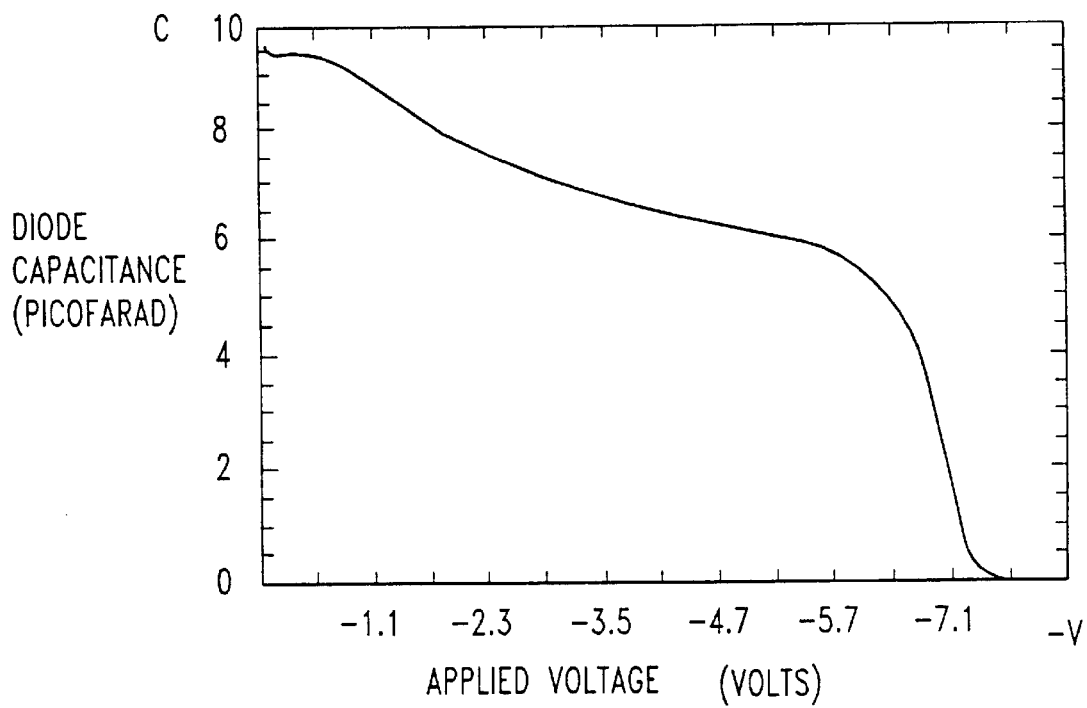
FIG. 5 is a graph of diode capacitance vs. applied voltage useful in understanding the performance characteristics of the present invention.

A Schottky diode, fabricated in accordance with the present invention and, in particular, the materials shown in FIG. 3, was tested and found to have the characteristics shown in FIGS. 4 and 5. The curve of FIG. 4 is a plot of the current-voltage (I-V) characteristics that were measured using capacitance-voltage (C-V) measurements. The following table lists some of the measured values for leakage current (-I) and corresponding values of reverse bias voltage (-V).

| Reverse Bias -V | Leakage Current -I |
|---|---|
| -60 volts | $2.1 \times 10^{-4}$ amperes |
| -40 volts | $7.5 \times 10^{-5}$ amperes |
| -20 volts | $4.2 \times 10^{-5}$ amperes |
| -10 volts | $3.0 \times 10^{-5}$ amperes |
| -1 volt | $2.5 \times 10^{-8}$ amperes |

A forward bias of +1 V in the tested sample produced a forward current of $6.2 \times 10^{-7}$ amperes (A), which is at least four orders of magnitude better than most conventional Schottky diodes. As can be seen from the forward bias portion of the I-V curve, and with particular reference to diode turn-on point "X" in FIG. 4, the barrier height for Schottky diode 10 is much higher than that of a normal Schottky diode. The barrier voltage for the tested diode was measured to be about 2.6 V at which the forward current was about $8.1 \times 10^{-5}$ A, which corresponds to point "X" in FIG. 4. These results surpass those found in existing devises.

For the reverse bias situation, the breakdown voltage was found to be extremely large in the negative direction, larger than -60 V as depicted in FIG. 4, indicating that barrier layer 15 had good insulating characteristics under reverse bias. However, the results clearly indicate that barrier layer 15 is not the same as a conventional insulator, since it can be used to form a Schottky contact and, therefore, supports forward current flow. Further, the above I-V table and curve of FIG. 4 show that the leakage currents at various levels of reverse bias are extremely small. These combined reverse-bias and forward-bias features make Schottky diode 10 an important device in high-power and low-noise applications.

FIG. 5 shows the results of the C-V measurements for the tested sample. The FIG. 5 curve does not depict typical C-V characteristics either for a conventional Schottky diode or for a normal insulator capacitor. In the range of zero to -0.55 V, the total capacitance measures more like that of a metal-insulator-metal capacitor; throughout that range the capacitance remains almost constant at 9.4 picofarads (pf). In the range of -0.05 to -6.50 V, the total capacitance acts like that of two serially connected capacitors, i.e., the capacitance of a metal-insulator-metal capacitor in series with that of a conventional Schottky contact. FIG. 5 shows that the total effective capacitance decreases as bias voltage increases in the negative direction. Schottky diode 10 responds in this manner because, as the reverse bias increases in the negative direction past -0.55 V, the depletion region reaches into the n-type channel layer 13. Increasing the depletion region width with reverse bias, decreases the capacitance of the channel layer 13 and, therefore, the total combined capacitance of diode 10. Further, when the reverse voltage goes beyond -6.50 V in the negative direction, the total capacitance quickly drops to zero because the depletion region width increases rapidly when the depletion region reaches the un-doped GaAs buffer layer 12. Consequently, the C-V characteristics suggest that its whole profile can be divided into three different bias regions. The first region can be explained by the behavior of a sole insulator capacitor; the second and third regions can be explained by the combination of an insulator capacitor in series connection with a Schottky-type capacitor. Because GaAs barrier layer 15 was not intentionally doped, hopping conduction appears to be the major process in both forward and reverse bias situations at room temperature.

It can be seen, therefore, that GaAs barrier layer 15 functions neither as a typical insulator nor a normal doped GaAs layer. GaAs barrier layer 15 has some of the characteristics of an insulator, but it also conducts. Its characteristics as an insulator bestow Schottky diode 10 with a turn-on voltage that is much higher than that of a typical Schottky diode. The insulator characteristics of GaAs barrier layer 15 also furnish Schottky diode 10 with an ability to withstand very high electrical fields. These features make Schottky diode 10 particularly useful in high-power applications. Another important advantage of the present invention is that the leakage current for Schottky diode 10 is several orders smaller than it is for conventional Schottky diodes at much higher voltages. This feature makes Schottky diode 10 useful in applications where low noise is a requirement.

Obviously many modifications and variations of the present invention are possible in the light of the above teachings. For example, the inventive technique may be readily applied to a variety of other electronic devices and circuits where Schottky-diode junctions can be employed. It is therefore to be understood, that within the scope of the appended claims, the invention may be practiced otherwise than as specifically described.

What is claimed is:

1. A Schottky diode comprising:

a semiconductor substrate;

a channel layer located on said substrate;

a barrier layer located on said channel layer, said barrier layer having charge carrier means for permitting forward current flow across the interface of said barrier layer and said channel layer;

a first diode terminal located to encircle the barrier layer on said channel layer; and a second diode terminal located on said barrier layer, said second diode terminal forming a Schottky-diode junction at the interface of said second diode terminal and said barrier layer.

2. The Schottky diode of claim 1 wherein said channel layer includes a layer of n-type material.

3. The Schottky diode of claim 2 wherein said barrier layer comprises a layer of un-doped material having a sufficient quantity of free electrons to support said forward current flow.

4. The Schottky diode of claim 2 wherein said barrier layer includes a non-stoichiometric layer of un-doped, low-temperature-grown semiconductor material having a sufficient quantity of free electrons to support said forward current flow.

5. The Schottky diode of claim 4 wherein said substrate includes a substrate buffer layer on which said channel layer is located.

6. The Schottky diode of claim 5 wherein said non-stoichiometric layer of un-doped, low-temperature-grown semiconductor material comprises gallium-arsenide.

7. The Schottky diode of claim 6 wherein said channel layer comprises a region of gallium-arsenide doped with silicon.

8. The Schottky diode of claim 7 wherein said first diode terminal includes an ohmic contact.

9. The Schottky diode of claim 8 wherein said second diode terminal includes metal layers of titanium and gold.

10. The Schottky diode of claim 9 wherein said first diode terminal includes layers of gold, germanium, nickel, silver and gold.

11. A Schottky diode comprising:

a semiconductor substrate;

a channel layer grown on said substrate;

a barrier layer grown on said channel layer, said barrier layer including a non-stoichiometric layer of un-doped, low-temperature-grown semiconductor material having a sufficient quantity of free charge carriers to support current flow therein;

a first diode terminal deposited on said channel layer to encircle the barrier layer; and a second diode terminal deposited on said barrier layer, said second diode terminal forming a Schottky-diode junction at the interface of said second diode terminal and said barrier layer.

12. The Schottky diode of claim 11 wherein said charge carriers are electrons and said channel layer includes a layer of n-type material.

13. The Schottky diode of claim 12 wherein said barrier layer comprises means for maintaining said sufficient quantity of free electrons to support said current flow when a forward bias is applied to said diode terminals and for depleting said barrier layer of said free electrons when a reverse bias is applied to said diode terminals.

14. The Schottky diode of claim 13 wherein said substrate includes a buffer layer on which said channel layer is located.

15. The Schottky diode of claim 14 wherein said non-stoichiometric layer of un-doped, low-temperature-grown semiconductor material comprises gallium-arsenide.

16. The Schottky diode of claim 15 wherein said channel layer comprises a region of gallium-arsenide doped with silicon.

17. The Schottky diode of claim 16 wherein said first diode terminal includes an ohmic contact.

18. The Schottky diode of claim 17 wherein said second diode terminal includes metal layers of titanium and gold.

19. The Schottky diode of claim 18 wherein said first diode terminal includes layers of gold, germanium, nickel, silver and gold.

* * * * *